US006494958B1

(12) United States Patent
Shamouilian et al.

(10) Patent No.: US 6,494,958 B1
(45) Date of Patent: Dec. 17, 2002

(54) PLASMA CHAMBER SUPPORT WITH COUPLED ELECTRODE

(75) Inventors: Shamouil Shamouilian, San Jose, CA (US); Jon M. McChesney, San Ramon, CA (US); Kwok Manus Wong, San Jose, CA (US); Liang-Guo Wang, Milpitas, CA (US); Alexander M. Veytser, Mountain View, CA (US); Dennis S. Grimard, Ann Arbor, MI (US)

(73) Assignee: Applied Materials Inc., Santa Clara, CA (US)

( * ) Notice: Subject to any disclaimer, the term of this patent is extended or adjusted under 35 U.S.C. 154(b) by 108 days.

(21) Appl. No.: 09/607,100

(22) Filed: Jun. 29, 2000

(51) Int. Cl.[7] .......................... C23C 16/00; H05H 1/00
(52) U.S. Cl. ................. 118/728; 118/723 E; 118/723 I; 156/345.51; 156/345.48; 156/345.43
(58) Field of Search .................. 118/728, 723 E, 118/723 I, 725, 724; 156/345.51, 345.48, 345.43, 345.44, 345.47, 345.52, 345.53; 315/111.61, 111.21, 111.51; 204/298.31, 298.34, 298.01

(56) References Cited

U.S. PATENT DOCUMENTS

| 4,184,188 A | 1/1980 | Briglia ........................ 361/234 |
| 4,767,641 A | 8/1988 | Kieser et al. ................. 427/38 |

(List continued on next page.)

FOREIGN PATENT DOCUMENTS

| EP | 0467390 | 1/1992 |
| EP | 0660499 | 6/1995 |
| JP | 03127822 | 5/1991 |
| WO | 9514308 | 6/1994 |

OTHER PUBLICATIONS

Shan, et al., "Process Kit and Wafer Temperature Effects on Dielectric Etch Rate and Uniformity of Electrostatic Chuck," *J. Vac. Sci. Technol. B*, vol. 14, No. 1, Jan./Feb. 1996; pp. 521–526.

Shan, et al., "Process Kit and Wafer Temperature Effects on Dielectric Etch Rate and Uniformity of Electrostatic Chuck," presented at the Third International Workshop on Advanced Workshop on Advanced Plasma Tools: Sources, Process Control, and Diagnostics on May 4, 1995.

U.S. patent application entitled, "Shield or Ring Surrounding Semiconductor Workpiece in Plasma Chamber"; filed Sep. 16, 1997; Ser. No. 08/931,864; Inventors: Ke, et al.

(List continued on next page.)

*Primary Examiner*—Gregory Mills
*Assistant Examiner*—P. Hassanzadeh
(74) *Attorney, Agent, or Firm*—Ashok Janah; Joseph Bach

(57) ABSTRACT

A process chamber 110 capable of processing a substrate 30 in a plasma of process gas. The chamber 110 comprises a support 200 having a dielectric 210 covering an electrode 220 and a conductor 230 below the electrode 220. A voltage supply 180 supplies a gas energizing voltage to the conductor 220, and the conductor is adapted to capacitively couple the voltage to the electrode 220 to energize the process gas. Alternatively, the voltage may be supplied to the electrode 220 through a connector 195 which can capacitively couple with the conductor 230. A DC power supply 190 may also provide an electrostatic chucking voltage to the electrode 220. In one version, the conductor 230 comprises an interposer 280.

20 Claims, 4 Drawing Sheets

U.S. PATENT DOCUMENTS

| | | | |
|---|---|---|---|
| 4,771,730 A | | 9/1988 | Tezuka ........................ 118/723 |
| 5,074,456 A | | 12/1991 | Degner et al. ............... 228/121 |
| 5,213,658 A | | 5/1993 | Ishida ......................... 156/643 |
| 5,250,137 A | * | 10/1993 | Arami et al. ................ 156/345 |
| 5,252,178 A | | 10/1993 | Moslehi ....................... 156/643 |
| 5,255,153 A | * | 10/1993 | Nozawa et al. ............. 361/234 |
| 5,271,788 A | | 12/1993 | Hasegawa et al. .......... 156/345 |
| 5,275,683 A | | 1/1994 | Arami et al. ................ 156/345 |
| 5,280,156 A | | 1/1994 | Niori et al. .................. 219/385 |
| 5,292,399 A | | 3/1994 | Lee et al. .................... 156/643 |
| 5,298,465 A | | 3/1994 | Levy ........................... 437/225 |
| 5,311,452 A | * | 5/1994 | Yokota et al. ................. 702/98 |
| 5,315,473 A | | 5/1994 | Collins et al. ............... 361/234 |
| 5,330,607 A | | 7/1994 | Nowicki ...................... 156/345 |
| 5,352,294 A | | 10/1994 | White et al. ................. 118/725 |
| 5,423,918 A | | 6/1995 | Gupta et al. ..................... 134/1 |
| 5,460,684 A | * | 10/1995 | Saeki et al. .................. 156/345 |
| 5,474,649 A | | 12/1995 | Kava et al. ............... 156/643.1 |
| 5,484,486 A | | 1/1996 | Blackburn et al. .......... 118/728 |
| 5,539,179 A | * | 7/1996 | Nozawa et al. ........ 219/121.43 |
| 5,552,124 A | | 9/1996 | Su .............................. 156/345 |
| 5,556,501 A | | 9/1996 | Collins et al. ............... 156/345 |
| 5,622,593 A | * | 4/1997 | Arasawa et al. ............. 156/345 |
| 5,625,526 A | * | 4/1997 | Watanabe et al. ........... 361/234 |
| 5,660,740 A | * | 8/1997 | Komio ......................... 216/67 |
| 5,665,166 A | * | 9/1997 | Deguchi et al. ......... 118/723 E |
| 5,665,167 A | * | 9/1997 | Deguchi et al. ............. 118/728 |
| 5,673,922 A | | 10/1997 | Sherstinsky et al. ......... 279/133 |
| 5,685,914 A | | 11/1997 | Hills et al. ............... 118/723 E |
| 5,740,009 A | | 4/1998 | Pu et al. ...................... 361/234 |
| 5,801,915 A | * | 9/1998 | Kholodenko et al. ....... 361/234 |
| 5,948,165 A | * | 9/1999 | Tamura ....................... 118/715 |
| 6,023,405 A | * | 2/2000 | Shamouilian et al. ....... 361/234 |
| 6,074,488 A | * | 6/2000 | Roderick et al. ............ 118/728 |
| 6,108,189 A | * | 8/2000 | Weldon et al. .............. 361/234 |

OTHER PUBLICATIONS

U.S. patent application entitled, "Magnetically–Enhanced Plasma Chamber with Non–Uniform Magnetic Field"; filed Jan. 2, 1997; Ser. No. 08/735,444.

U.S. patent application entitled, "High Density Plasma Process Chamber"; filed Jul. 14, 1997; Ser. No. 08/893,599; Inventors: Shamouilian, et al.

U.S. patent application entitled, Plasma Chamber Support Having an Electrically Coupled Collar Ring; Ser. No. 08/931,708; Inventors: Roderick, et al.

* cited by examiner

PLASMA CHAMBER SUPPORT WITH COUPLED ELECTRODE

BACKGROUND

The invention relates to a support for supporting a substrate in a chamber and related methods.

In the manufacture of integrated circuits, a substrate is processed by a plasma of process gas in a chamber. The substrate is typically supported in the chamber by a support, a portion of which may comprise a dielectric material covering an electrode. The electrode may be charged to electrostatically hold the substrate, to energize the process gas in the chamber, or to do both. In addition, the support may comprise a heater to heat the substrate, or a heat exchanger, such as for example, channels through which heat transfer fluid may be circulated to heat or cool the substrate. In addition, a heat transfer gas, such as helium, may be introduced through a conduit in the support to below the substrate to enhance heat transfer rates to and from the substrate.

Electrostatic chucks are typically either Coulombic or Johnsen-Rahbek type. Coulombic electrostatic chucks use a dielectric material having a higher electrical resistance to generate coulombic electrostatic forces. Johnsen-Rahbek type (JR) electrostatic chucks utilize dielectric layers that are made of a semiconducting material, for example one or more semiconducting ceramics such as aluminum nitride or oxide ceramics, that at least partially conducts electricity. The JR chucks often provide higher electrostatic clamping forces for a lower applied voltage.

A disadvantage of electrostatic chucks, particularly the Johnsen-Rahbek type electrostatic chucks, is that they may result in sporadic micro-arcs within the plasma in the chamber. Additionally, the plasma can often become unstable or destabilize with these chucks. The micro-arcs and destabilized plasmas can result in significant damage to a substrate and can also cause sporadic and temporary loss of chucking force. The micro-arcs can also deteriorate the components in the process chamber, such as the dielectric materials.

Another problem with conventional electrostatic chucks is that they may result in an unevenly distributed plasma sheath. In a typical process chamber, a gas distributor introduces process gas and a plasma is energized, for example by applying an RF voltage to a cathode supporting the substrate and by electrically grounding an anode to form a capacitive field in the process chamber. An electrostatic chuck above the cathode electrostatically holds the substrate. However, the dielectric material in the electrostatic chuck can affect electrical coupling from the cathode to the plasma which can result in an unevenly distributed plasma sheath. The lack of spacial uniformity of the plasma sheath can result in inadequately and inconsistently processed substrates.

In another chamber design, a relatively thick insulator shield is used to electrically isolate a peripheral cathode portion. However, the insulator shield may reduces the RF current between the cathode and the plasma at the periphery of the substrate. The resultant non-uniform plasma across the surface of the substrate can cause the peripheral portion of the substrate to be non-uniformly processed relative to the central portion. Plasma processing may also be nonuniform when the cathode does not extend all the way to the peripheral edge of the substrate, as for example in chambers where the cathode has a diameter slightly smaller than that of the substrate. As a result of these effects, the peripheral substrate portion often has reduced yields.

Thus, there is a need for a chamber capable of providing a uniform plasma across the substrate surface, and in particular, across the peripheral edge of the substrate. There is also a need for a chamber that may be used to extend the plasma beyond the peripheral edge of the substrate. There is a further need to stabilize the plasma and reduce arcing, especially when using electrostatic chucks.

SUMMARY

The present invention satisfies these needs. In one aspect the invention comprises a support capable of supporting a substrate in a chamber. The support comprises a dielectric covering an electrode, the dielectric having a surface capable of receiving the substrate, a conductor capable of capacitively coupling with the electrode, and a voltage supply adapted to supply an RF voltage to the conductor.

In another aspect of the invention, a process chamber capable of processing a substrate in a plasma comprises a gas distributor adapted to introduce process gas in the chamber, a dielectric covering an electrode, the dielectric having a surface capable of receiving the substrate, a conductor capable of capacitively coupling with the electrode, and a voltage supply adapted to supply a gas energizing voltage to the conductor.

In another aspect of the invention, a process chamber capable of processing a substrate in a plasma comprises a gas distributor adapted to introduce process gas in the chamber, a dielectric covering an electrode, the dielectric having a receiving surface adapted to receive the substrate, a conductor comprising a first conductor and an interposer between the first conductor and the dielectric, and a voltage supply capable of supplying a gas energizing voltage to the electrode.

In another aspect of the invention, a support capable of supporting a substrate in a chamber comprises a dielectric covering an electrode, the dielectric having a surface capable of receiving the substrate, a connector capable of supplying a voltage to the electrode, and a conductor capable of capacitively coupling with the connector.

In another aspect of the invention, a process chamber capable of processing a substrate in a plasma comprises a gas distributor adapted to introduce process gas in the chamber, a dielectric covering an electrode, the dielectric having a surface capable of receiving the substrate, a connector capable of supplying a voltage to the electrode, a conductor capable of capacitively coupling with the connector, and a voltage supply adapted to supply a gas energizing voltage to the conductor or to the electrode.

In another aspect of the invention, a method of processing a substrate in a process zone comprises supporting the substrate on a support in the process zone, the support comprising a dielectric covering an electrode, distributing process gas in the process zone, and energizing the process gas by coupling RF power from the electrode to the energized gas without supplying an RF voltage directly to the electrode.

In another aspect of the invention, a method of processing a substrate in a process zone comprises supporting the substrate on a support in the process zone, the support comprising an electrode, introducing process gas into the process zone, supplying a voltage to a conductor below the electrode, and capacitively coupling the voltage from the conductor to the electrode to energize the process gas.

In another aspect of the invention, a method of processing a substrate in a process zone comprises supporting the substrate on a support in the process zone, the support comprising an electrode, introducing process gas into the process zone, supplying a gas energizing voltage to the electrode through a connector, and capacitively coupling the gas energizing voltage from the connector to a conductor below the electrode.

DRAWINGS

These features, aspects, and advantages of the present invention will become better understood with regard to the following description, appended claims, and accompanying drawings which illustrate examples of the invention. However, it should be understood that each of the features can be used in the invention in general, not merely in the context of the particular drawings, and the invention includes any combination of these features, where:

DESCRIPTION

Figure 1:
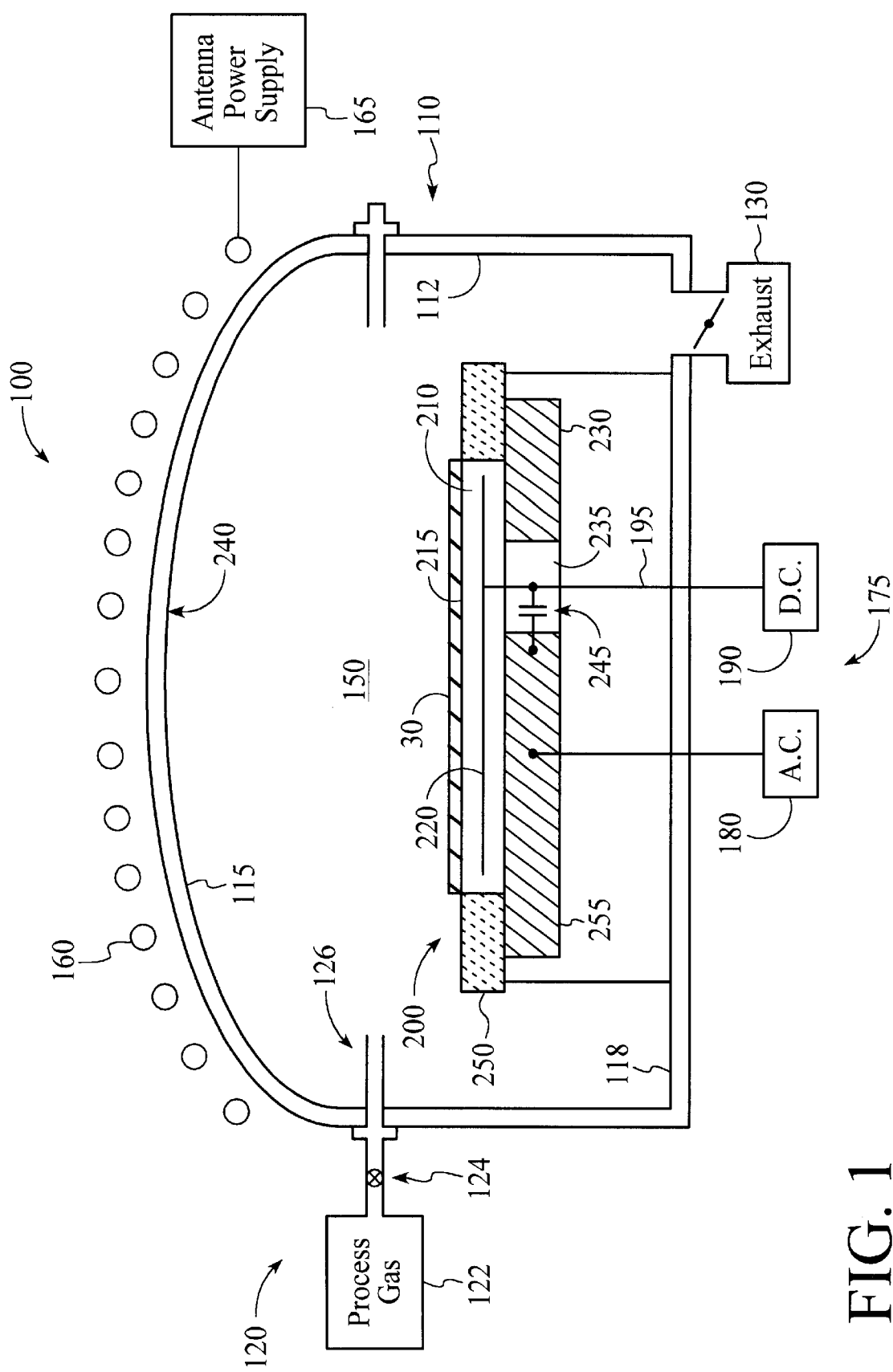
FIG. 1 is a schematic sectional side view of a substrate processing apparatus with a version of a substrate support having a conductor capable of capacitively coupling with an electrode.
Figure 2:
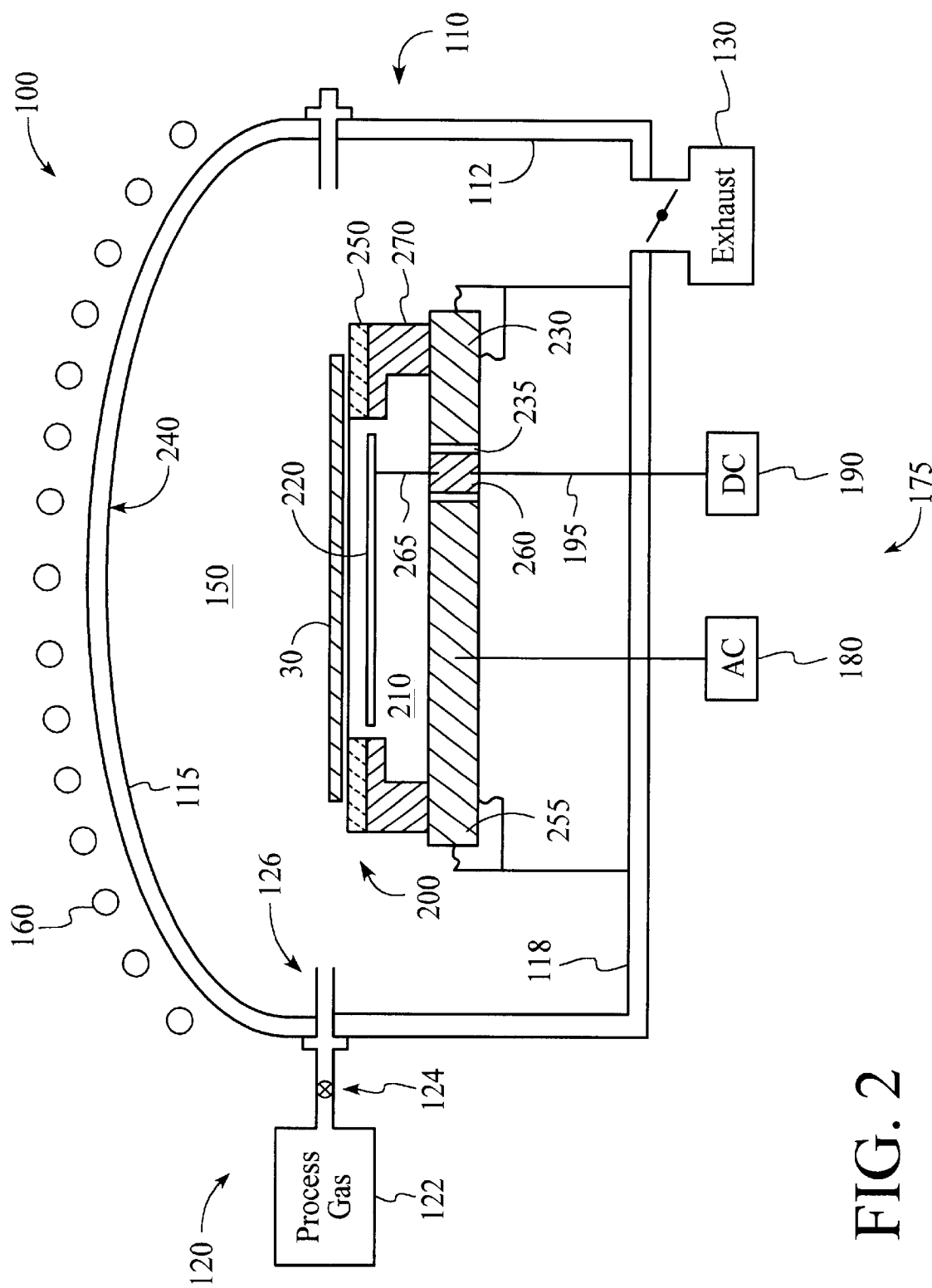
FIG. 2 is a schematic sectional side view of a version of a substrate processing apparatus with another version of a substrate support having a conductor capable of capacitively coupling with an electrode.
Figure 3:
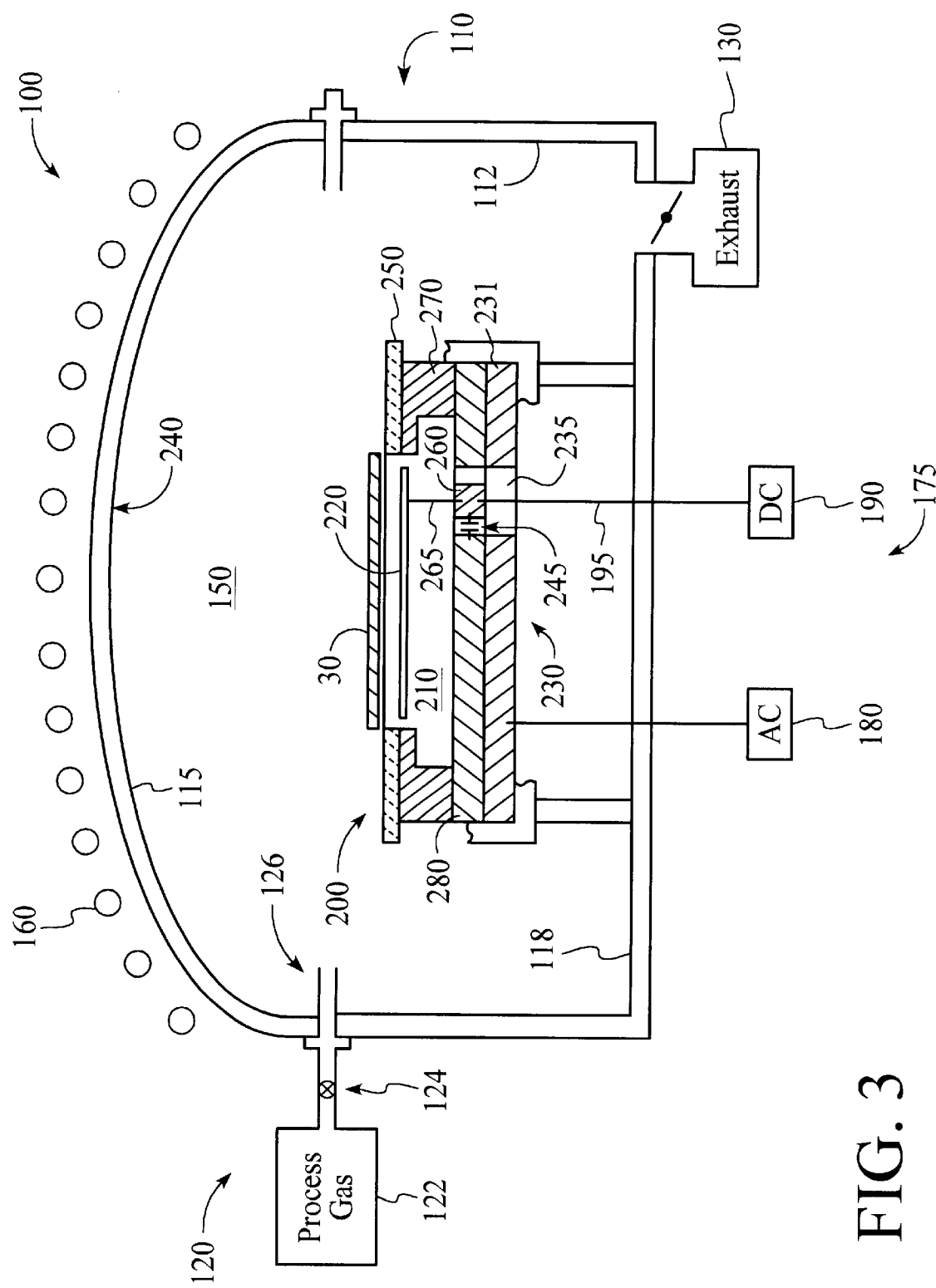
FIG. 3 is a schematic sectional side view of a version of a substrate processing apparatus with a version of a substrate support having a conductive interposer.

The present invention relates to an apparatus that is used to support a substrate 30 while, for example, etching the substrate 30 by a plasma, implanting material in the substrate 30 by ion implantation, depositing material on a substrate 30 by chemical vapor deposition or sputtering, or performing other processes. An exemplary plasma processing apparatus 100, suitable for processing a substrate, such as a semiconductor wafer 30, is shown in FIG. 1 and generally comprises an enclosed process chamber 110 having sidewalls 112, a ceiling 115, and a bottom wall 118. The process chamber 110 and the various components therein can be made from a variety of materials including metals, ceramics, glasses, polymers and composite materials, using conventional machining and molding methods. Metals that can be used to fabricate the process chamber 110 and components therein, include aluminum, anodized aluminum, "HAYNES 242," "Al-6061," "SS 304," "SS 316," and INCONEL, of which anodized aluminum is preferred. Process gas is introduced into the chamber 110 through a gas distributor system 120 which may include a process gas supply 122, a gas flow control system 124, and a gas distributor 126. The process gas is introduced adjacent to the periphery of the substrate 30, as shown in FIGS. 1–3. Alternatively, the process gas may be introduced from above the substrate 30 through a perforated "showerhead" gas diffuser (not shown) or through upwardly extending gas distributors (not shown). An exhaust system 130, comprising one or more exhaust pumps and throttle valves, is used to exhaust spent process gas byproducts and to control the pressure in the chamber 110. Typically, a computer control system operates the gas distributor system 120 and the exhaust system 130 using programmed process conditions. The particular embodiment of the apparatus shown herein is provided only to illustrate operation of the invention and should not be used to limit the scope of the invention.

After the process gas is introduced into the chamber 110, the gas is energized to form a plasma 150. An antenna, such as one or more inductor coils 160, may be provided adjacent to the chamber 110. An antenna power supply 165 powers the antenna 160 to inductively couple energy, such as RF energy, to the process gas to form the plasma 150 in a process zone in the chamber 110. Alternatively, or in addition, process electrodes comprising a cathode below the substrate 30 and an anode above the substrate 30 may be used to couple RF power to the plasma in a manner to be described below. A power source 175 comprising an AC source 180 and a DC source 190 may be used to supply power to the process electrodes. The AC source 180 may comprise a generator and a bias RF match circuit. The operation of the power source 175 may be controlled by a controller that also controls the operation of other components in the chamber 110.

A support 200 for holding the substrate 30 is positioned within the chamber 110. The support 200 comprises a dielectric 210 having a substrate supporting surface 215. A layer of dielectric 212 covers an electrode 220 and another layer of dielectric 214 separates the electrode 220 from a conductor 230. In the version shown in FIG. 1, the electrode 220 is embedded within the dielectric 210. In another version, a multilayered or laminated dielectric 210 may be provided. The support 200 may be used to produce an electrostatic chucking force to electrostatically attract and hold the substrate 30 to the support 200 by supplying a DC chucking voltage to the electrode 220 from DC source 190 and connector 195, such as a DC line, lead or cable, through an electrical connection such as a banana jack inserted through the dielectric 210 and conductor 230, as described in U.S. patent application Ser. No. 08/893,599, filed on Jul. 14, 1997, and entitled "High Density Plasma Process Chamber," which is incorporated herein by reference. The DC power supply 190 typically provides a DC chucking voltage of about 200 to about 2000 volts to the electrode 220. The DC power supply 190 may also include a system controller for controlling the operation of the electrode 220 by directing a DC current to the electrode 220 for chucking and dechucking the substrate 30.

The electrostatic chuck may be either monopolar, which operates as discussed above or bipolar. A bipolar electrostatic chuck comprises a base composed of aluminum or other metal or ceramic. The base functions as an electrode and a second electrode is embedded therein. The electrodes are electrically isolated by a dielectric. A DC potential of a particular polarity is applied to one electrode and an opposite polarity is applied to the other electrode. The same source can be used for applying the potentials. The opposite potentials at the respective electrodes are electrostatically coupled to the substrate 30. On the underside of the substrate 30 across from the negatively charged electrode, positive charges are formed. Similarly on the underside of the substrate 30 across from the positive electrode, negative charges are formed. The substrate 30 is thereby held on the chuck by electrostatic force. The electrodes can be interdigitating electrodes embedded in a dielectric. The electrostatic chuck can be provided with a small gap, such as a gap of less than about 10 microns, and more preferably of about 1 to about 5 microns between the substrate 30 and the chuck. This gap allows for the introduction of heat transfer facilitating gas between the chuck and the substrate 30 to cool the substrate 30 during processing. Exemplary electrostatic chucks are disclosed for example in U.S. Pat. No. 4,184,188 to Briglia, U.S. Pat. No. 4,399,016 to Tsukada et al., U.S. Pat. No. 4,384,918 to Abe and in *Jpn. J. Appl. Phys.*, Vol. 31 (1992) Pt 1, No. 1 article entitled "Electrostatic Force and Absorption Current of Alumina Electrostatic Chuck" to Watanabe et al., all of which are incorporated herein by reference. Johnsen-Rahbek electrostatic chucks are disclosed for example in U.S. Pat. No. 5,117,121 to Watanabe et al. and U.S. Pat. No. 5,463,526 to Mundt, both of which are incorporated herein by reference.

When used in plasma and energized gas environments, electrostatic chucks have produced heretofore unexplained micro-arcs and plasma destabilization. It has been determined by Plasma Damage Monitor (PDM) techniques, which measure the charge deposited on an oxide wafer, that potential differences large enough to cause device damage are induced on the substrate during the presence of the micro-arcs and destabilized plasmas. One source of the micro-arcs and plasma destabilization is the presence of unwanted DC voltages in the process chamber 110, particularly when the DC voltages are over 1000 volts. Isolation of the DC voltage and shielding of the chamber 110 from the DC voltage has been shown to reduce the micro-arcs and plasma destabilization and results in improved substrate 30 processing adequacy and consistency. Arcing has also been discovered to occur when a DC path from the plasma to the DC power supply exists. This condition also can lead to dechucking or insufficient chucking of the wafer.

In one version of the invention, the connector 195 carrying the DC voltage passes through dielectric material 235 that extends through the conductor 230 to electrically isolate the connector 195 from the conductor 230. In this manner, the DC voltage is substantially shielded from the chamber 110 and the plasma 150, and a significantly more stable plasma results. The dielectric material 235 may be a plug of dielectric material shaped to fit into an opening in the conductor 230 or may be an extension of the dielectric 210. In one version, the dielectric material 235 is an integral extension of at least a portion of the dielectric 210, i.e., the dielectric material 235 and a portion of the dielectric 210 are fabricated from a unitary piece of material. Alternatively, the dielectric material 235 may be in the form of an insulating coating applied over the connector 195.

In one version, the electrode 220 may also serve as a plasma generating electrode. A process electrode 240 comprising a conductor element is positioned in the chamber 110 directly over the substrate 30, or at another position in or adjacent to the chamber 110, and may be sufficiently large to encompass substantially the entire area of the substrate 30. By applying an RF voltage to the electrode 220, the electrode 220 and the process electrode 240 capacitively couple to form an RF electric field in the chamber 110, as described in U.S. patent application Ser. No. 08/893,599, and thereby generate or sustain a plasma 150 or energize a plasma 150.

In one version, such as the version shown in FIG. 1, a plasma generating RF voltage is indirectly applied to the electrode 220 by the AC power source 180. The AC power source 180 provides an RF voltage directly to the conductor 230. The voltage may have one or more frequencies from about 400 kHz to about 60 MHz at a power level of typically from about 50 to about 5000 Watts to the conductor 230. The conductor 230 is connected to the electrode 220 by one or more RF coupling capacitors 245. The RF coupling capacitor 245 may directly connect the conductor 230 to the electrode 220 or, as shown in FIG. 1, to the connector 195 leading to the electrode 220, or to any other intermediate member. Alternatively, the RF and DC may both be applied to the connector 195 and the RF may then be coupled onto the conductor 230 by the one or more coupling capacitors 245.

The version shown in FIG. 1 has several advantages over conventional process chambers and substrate supports. The DC voltage is isolated from the plasma and is applied to the electrode directly below the substrate 30 where it does not come in contact with the plasma, thus reducing arcing in the plasma. Furthermore, the plasma may be extended beyond the edge of the substrate because in addition to the capacitive coupling of the electrode 220 and the process electrode 240, the conductor 230 serves to capacitively couple RF power to the plasma 150 through a collar ring 250 which is positioned on the peripheral portion 255 of the conductor 230. It is believed that this results in an extended plasma sheath that uniformly extends beyond the edge of the substrate 30. Additionally, by varying or adjusting the value of the coupling capacitor 245, the relative amount of RF power applied to the electrode 220 and to the conductor 230 may be controlled. This feature allows the plasma 150 to be tuned so as to generate a more spatially uniform distribution of the plasma 150 across the substrate 30. The capacitive coupling through the collar 250 also allows a plasma self bias to build up and clean process deposits from the collar 250.

The process electrode 240 may, in one version, be the ceiling 115 of the chamber 110. The ceiling 115 serves as a conductor which may be biased or grounded. The process electrode 240 may also be a semiconductor that provides low impedance to an RF induction field transmitted by the induction antenna 160. The semiconductor ceiling 115 may be sufficiently electrically conductive to serve as the process electrode 240 and may also be permeable to an RF induction field generated by the inductor antenna 160 above the ceiling 115.

The support 200 may be formed by covering, or embedding, the electrode 220 in the dielectric 210 which may comprise a dielectric material that serves to electrically insulate the electrode 220 and prevent electrical shorting to the plasma in the chamber 110. The dielectric 210 comprises a relatively low RF electrical field absorption that allows an RF electric field emanating from the electrode 220 to be capacitively coupled through the dielectric 210. Alternatively, the dielectric 210 may also comprise a semiconductor material with a low level of conductivity. The dielectric 210 has a smooth receiving surface having an RMS peak to peak roughness of less than 10 microns, that directly contacts and supports the substrate 30.

The dielectric 210 may comprise a unitary and discrete structure containing the electrode 220 and may be is fabricated as a monolithic structure from thermally fused ceramic or polymer. Monolith ceramics typically have low porosity, good electrical properties, and may entirely enclose the electrode 220 which lessens the need for insulator shields in the chamber 110. The high dielectric breakdown strength of the dense ceramic structure also allows application of higher RF power to the electrode 220. The dielectric 210 may be fabricated from a ceramic having a low porosity of less than about 20%, and preferably less than about 10%. Suitable ceramic materials include one or more of aluminum oxide, aluminum nitride, boron carbide, boron nitride, silicon oxide, silicon carbide, silicon nitride, titanium oxide, titanium carbide, yttrium oxide, beryllium oxide, and zirconium oxide. Alternatively, the dielectric 210 can comprise a laminate of polyimide or aramid layers stacked around the electrode 220 and typically fabricated by an autoclave pressure forming process, as disclosed in U.S. patent application Ser. No. 08/381,786, to Shamouilian, filed on Jan. 31, 1995, which is incorporated herein by reference. Alternatively, the dielectric 210 may comprise a semiconductor material such as undoped or doped ceramic materials. The electrode 220 embedded in the dielectric may be fabricated from a conductive metal which allows thermal sintering of the dielectric with the embedded electrode. The dielectric 210 with the embedded electrode 220 can be fabricated by isostatic pressing, hot pressing, mold casting, or tape casting, from a mixture of ceramic powders and a low concentration of organic binder material.

The dielectric 210 can also comprise gas feed through holes (not shown) that extend therethrough for providing helium heat transfer gas to the receiving surface below the substrate 30. The helium gas feedthrough holes have a diameter sufficiently small to prevent plasma glow discharge of the helium in the holes, which may be from about 0.5 to about 10 mils (about 13 to about 250 microns), and more preferably from about 0.5 to about 2 mils, otherwise the helium gas forms plasma glow discharges or electrical arcing at the termination end of the hole. In one version, a series of gas feed-thorough holes are provided around its circumference to provide a uniform distribution of heat transfer gas to the region below the substrate 30.

The electrical properties of the dielectric 210 are selected to obtain a low electrical conductivity. Preferably the dielectric 210 comprises a volume resistivity of about $10^8$ to about $10^{16}$ ohms-cm. As shown in FIG. 1, the dielectric 210 comprises a cover layer that electrically insulates the electrode 220 to prevent shorting of the plasma in the chamber 110 and to isolate the substrate 30 from the electrode 220. The cover layer of dielectric 210 may be made from a dielectric material that is permeable to the RF energy supplied to the electrode 220 to allow capacitive coupling through the cover layer to the plasma and the process electrode 240. The dielectric constant, electric field susceptibility, and thickness of the cover layer of dielectric 210 are selected to enhance capacitive coupling of the RF voltage between the electrode 220 and the process electrode 240. In addition, the cover layer of dielectric 210 allows a DC voltage applied to the electrode 220 to electrostatically hold the substrate 30 by Coulombic or Johnsen-Rahbek forces. Preferably, the cover layer comprises a dielectric constant of at least about 2.

The RF reactance of different layers of dielectric 210 may be tailored to achieve the desired coupling or the desired non-coupling therethrough. For example, the dielectric cover layer above the top electrode 220 may comprise an RF reactance of about 0.1 to about 500 Ohms, more preferably from about 0.1 to about 50 Ohms, and most preferably from about 0.1 to about 5 Ohms; and the support layer between the electrode 220 and the conductor 230 may comprises an RF reactance of about 100 to about 10000 Ohms, and more preferably 100 to 1000 Ohms. The minimum thickness of the dielectric layer above the electrode 220 may be determined by the formula $C=(E_o E_r A)/L$; where $C$ (F) is the capacitance, $L$ (m) is the minimum thickness of the dielectric layer, $A$ (m$^2$) is the area, $E_o$ is the permittivity of free space in metric units, which is about $8.8542 \times 10^{-12}$ F m$^{-12}$, and $E_r$ is the relative dielectric constant of the dielectric material. The thickness of the dielectric layer of the dielectric 210 that is above the electrode 220 and below the electrode 220 depends upon the electrical properties of the dielectric material, such as dielectric constant and resistivity. The thickness of the dielectric 210 above the electrode 220 is sufficiently thin to allow the electrode 220 to capacitively couple RF power to the plasma through the overlying substrate 30 without excessive attenuation of the RF power. A suitable thickness of the dielectric cover layer is from about 1 micron to about 5 mm, more preferably from about 1 micron to about 2 mm, and most preferably from about 100 microns to about 1 mm, for dielectric materials having a dielectric constant of about 4 to about 10. The thickness of dielectric material between the electrode 220 and the conductor 230 may be at least about 3 mm, more preferably at least about 10 mm and most preferably from about 10 to about 100 mm. For a typical chamber design having an impedance load of about 300 picofarad, the minimum thickness of the dielectric cover layer above the electrode 220 is typically about 0.5 mm.

The dielectric material 235 may, in one version, comprise a unitary and discrete structure and may be fabricated as a monolithic structure from thermally fused ceramic or polymer. The dielectric material 235 may be fabricated from a ceramic having a low porosity of less than about 20%, and preferably less than about 10%. Suitable ceramic materials include one or more of aluminum oxide, aluminum nitride, boron carbide, boron nitride, silicon oxide, silicon carbide, silicon nitride, titanium oxide, titanium carbide, yttrium oxide, and zirconium oxide. Alternatively, the dielectric material 235 can comprise a solid piece or a laminate of polyimide, polytetrafluoroethylene, aramid, or similar material. Alternatively, the dielectric material 235 may comprise semiconductor material, such as undoped or doped ceramic materials, such as alumina, titania, silicon carbide, silicon nitride, aluminum nitride, boron nitride, boron carbide, yttrium oxide, beryllium oxide, zirconium oxide, and mixtures thereof. In another alternative version, the dielectric material 235 may be removed and a space sufficiently large to isolate the connector 195 from the conductor 230 can be provided.

The electrical properties and dimensions of the dielectric material 235 are selected to isolate the DC voltage from the plasma 150. In the version shown in FIG. 1, the conductor 230 and the connector 195 are coupled through capacitor 245. The thickness of the dielectric material 235 should be sufficient to prevent unwanted electrical DC coupling between the conductor 230 and the connector 195. For example, the dielectric material 235 may comprise a DC resistance of about 10,000 Ohms to about 10 MOhms, and more preferably from about 1 MOhm to about 5 MOhms. A suitable thickness of the dielectric material 235 separating the connector 195 from the conductor 230 is from about 3 mm to about 15 mm, preferably from about 5 mm to about 10 mm, and most preferably about 8 mm.

The RF coupling capacitor 245 may be, for example, RF high power porcelain capacitors which are available from American Technical Ceramics Corporation. The value of the RF coupling capacitor 245 may be selected to provide a substantially uniform plasma sheath across the substrate. For example, suitable capacitor values are from about 800 pF to about 7 nF. The capacitor values determine the ratio of RF power applied to the conductor 230 and to the electrode 220. The capacitor value depends on several factors, such as chamber component thicknesses and materials. For example, space constraints and DC and RF voltage application may alter the necessary capacitor values.

In another embodiment, as shown in FIG. 2, the RF coupling capacitor 245 is removed. Instead, the thickness of the dielectric material 235 is selected to allow for capacitive coupling between the conductor 230 and the connector 195.

In this version, properties and dimensions of the dielectric material 235 are selected to isolate the DC voltage from the plasma 150 and to capacitively couple the conductor 230 and the connector 195. For example, the dielectric material 235 may comprise an RF reactance of about 0.01 to about 50 Ohms, and more preferably from about 0.1 to about 5 Ohms. A suitable thickness of the dielectric material 235 separating the conductor 230 and the connector 195 is from about 0.1 micron to about 5 mm, more preferably from about 25 micron to about 500 microns, and most preferably about 50 microns. As with the version shown in FIG. 1, the RF and DC voltages may both be applied to the connector 195 and the RF may be coupled from the connector 195 to the conductor 230.

The connector 195 may further comprise a conductive member 260, such as a plate or rod, which may be provided within the dielectric material 235, as shown in FIG. 2, to improve the capacitive coupling though the dielectric material 235 by increasing the coupling area between the connector 195 and the conductor 230. The connector 195 may be releasably or permanently attached to the conductive member 260 and an additional line or connector 265 may be releasably or permanently attached to the conductive member 260 to supply the DC voltage and the RF voltage to the electrode 220. The conductive member 260 is made of conductive material. In one version the conducting plate 260 comprises a metal plate or rod, such as an aluminum plate or rod. The conductive member 260 may be provided with an increased surface area shape, such as the T-shaped cross-sectional configuration shown in FIGS. 4 and 5, in order to improve the capacitive coupling between the conducting plate 260 and the conductor 230.

The electrode 220 may be fabricated from a conductive metal such as aluminum, copper, silver, gold, molybdenum, tantalum, titanium, or mixtures thereof. The conductive metals may comprise high melting point metals, such as copper, tantalum, tungsten, platinum, rhenium, hafnium, and alloys thereof, which are preferred when the dielectric is formed using high temperature processing. The electrode 220 can comprise a layer of conducting material, for example a copper layer from about 100 to 1000 microns thick, that is embedded in the dielectric 210. Alternatively, the electrode 220 can comprise a mesh of wire having a diameter of about 100 microns to about 1000 microns, a mesh size of about 5 to 200 mesh, and a circular, elliptical or rectangular cross-section. The electrode 220 can also comprise one or more conductors that are electrically isolated from one another, such as for example bipolar or tripolar electrodes, that are maintained at different electric potentials. In another version, the electrode 220 comprises a mesh made of electrically conductive wires, each wire having a longitudinal central axis that is oriented substantially parallel to the plane of the mesh electrode. Because of voids or interstices between the wires, the mesh comprises less metal than an equivalently sized solid electrode, and consequently is subject to less thermal expansion.

The conductor 230 below the dielectric 210 is made of an electrically conducting material and has an upper surface suitable for supporting the dielectric 210 in the process chamber 110. In one configuration, the conductor 230 comprises a metal plate, such as an aluminum plate, positioned immediately below the dielectric 210. The peripheral portion 255 extends beyond the perimeter of the electrode 220 and may also extend beyond the peripheral edge of the substrate 30. The RF voltage applied to the conductor 230 provides an RF voltage that is electrically conducted to the peripheral portion 255 of the conductor 230. In this manner, the conductor 230 capacitively couples with the plasma 150 through the collar ring 250 to extend the plasma sheath to or beyond the region near the periphery of the substrate 30.

The collar 250 is positioned on the peripheral portion 255 of the conductor 230 and may be in direct electrical contact with the peripheral portion 255. The collar 250 is sufficiently permeable to allow RF power from the peripheral portion 255 of the conductor 230 to be coupled to the plasma through the collar 250, thereby causing effects of the plasma to extend beyond the perimeter of the substrate 30. This may allow ions near the surface of the collar 250 to be energized to remove process byproducts therefrom. It is believed that this occurs because the peripheral electric field is electrically coupled from the peripheral portion 255 of the conductor 230 and provides electric field components that extend transversely through the collar 250 to complement the field components from the electrode 220. In this manner, the combination of the electrically conducting peripheral portion of the conductor 230 and the overlying collar 250 functions as an extension of the electrode 220 that generates an electrical field component perpendicular to, and extending around, the periphery of the substrate 30. As a result, the effective capacitive coupling area of the electrode 220 is increased by electric field spanning across the collar 250. The circumferential electric field provided by the electrically coupled collar around the perimeter of the substrate 30 is believed to provide a more uniform plasma distribution across the surface of the substrate 30.

The shape and size of the conductor 230 and the diameter of the collar 250 resting on the conductor 230 are selected to increase the active area of the electrode 220 and to provide a plasma that extends beyond the periphery of the substrate 30. The conductor 230 may comprise a smooth and polished upper surface that can evenly electrically couple RF power to the lower surface of the collar 250 without excessive uneven air gaps or electrical resistance therebetween. The smooth upper surface of the conductor 230 removes insulating air gaps at the interface of the conductor 230, electrode 220, and collar 250 to increase electrical coupling therebetween. In one embodiment, the conductor 230 is made from a metal plate shaped and sized to correspond to the shape and size of the substrate 30. For a circular substrate having a diameter of about 200 mm (8-inch), a suitable diameter for conductor 230 is from about 200 to about 220 mm.

The collar 250 may be an annular ring or layer of dielectric or semiconductor material covering the peripheral portion 255 of the conductor 230, that is sufficiently thin to couple RF power from the peripheral portion of the conductor 230 around the perimeter of the substrate 30. The shape and thickness of the collar 250 depend upon the electrical permeability of the material used to fabricate the collar, and in particular its absorption of electrical energy having the RF frequencies applied to the electrode 220. In one embodiment, the collar 250 is fabricated by forming a layer of dielectric or semiconductor material on the upper surface of the peripheral portion 255 of the conductor 230. The dielectric layer can be applied by flame spraying, plasma spraying, or solution coating.

In another version, the collar 250 comprises a solid annular ring having a lower coupling surface polished sufficiently smooth to provide uniform and even electrical coupling to the upper surface of the conductor 230. The smooth coupling surface reduces air gaps and other electrical impedances at the interface of the conductor 230 and the collar 250. The coupling surface preferably comprises an RMS roughness of less than about 10 microns peak to peak, more preferably less than about 3 microns, and most preferably less than about 0.5 microns. Preferably, the annular ring is concentric to the electrode 220 and the conductor 230. The collar 250 can also have an upper surface capable of supporting the substrate 30. The upper surface of the collar 250 may be substantially coplanar to the upper receiving surface of the support 200 and extend to or beyond the perimeter of the substrate 30. The collar may also be removable from the support 200 to allow quick replacement of the collar when corroded or broken. In one version, the thickness of the collar 250 is from about 0.5 to about 10 mm.

The collar 250 may be made from a dielectric material having an RF electrical field absorption sufficiently low to capacitively couple RF power from the peripheral portion of the conductor 230 through the collar 250 to the plasma at RF frequencies of about 1 to about 20 MHz. The collar 250 may be composed of dielectric materials having a dielectric constant of at least about 2 and a dielectric breakdown strength of at least about 10 volts/micron. Suitable dielectric ceramic materials for fabricating the collar 250 include aluminum oxide, aluminum nitride, boron carbide, boron nitride, diamond, silicon oxide, silicon nitride, titanium oxide, titanium carbide, zirconium boride, zirconium carbide, and equivalents or mixtures thereof. Suitable polymeric materials for forming the collar 250 include polyimide, polyketone, polyetherketone, polysulfone, polycarbonate, polystyrene, polyvinylchloride, polypropylene, polyethersulfone, polyethylene, nylon, silicone, and rubber. In another version, for processes where the substrate 30 is heated, the dielectric material for the collar 250 may be selected from dielectric materials which are resistant to temperatures in excess of 200° C.

In another embodiment, the collar 250 is made from a semiconductor material that has low electrical resistance that allows DC field components to be transmitted or conducted through the collar 250. By semiconductor it is meant that the material has a higher electrical conductivity than insulator materials, and a lower electrical conductivity than metals. The semiconductor material has a resistivity sufficiently low to allow DC electric field components to be also electrically coupled from the conductor 230 to the collar 250 to provide a more consistent and uniform plasma sheath above the perimeter of the substrate. These DC field components even or balance out the DC potential at the edge of the substrate where edge effects are normally highly pronounced. The more balanced or level DC field potential across the substrate perimeter also reduces the possibility of electrical arcing at the edge of the electrode 220. The collar 250 may have a resistivity of about $10^1$ Ωcm to about $10^3$ Ωcm, and more preferably from about $10^1$ Ωcm to about $10^2$ Ωcm. Suitable semiconducting ceramic materials for fabricating the collar 250 include "doped" ceramic materials, such as mixtures of the ceramic materials described herein, such as aluminum oxide and titanium oxide, or aluminum nitride and other conduction additives.

In the version shown in FIG. 2, the conductor 230 is provided with a conductor extension 270 that extends upwardly from the peripheral portion 255 of the conductor 230. When RF power is supplied to the conductor 230, or is supplied to the connector 195 and then coupled to the conductor 230, it is also coupled from the peripheral portion 255 and the extension 270 through the collar 250. This coupling is believed to extend the plasma sheath beyond the substrate 30 and also to clean deposits off the surface of the collar 250. The extension 270 may be composed of the same or similar material as the conductor 230 and may be integral therewith or may serve as a metal clamp.

Figure 4:
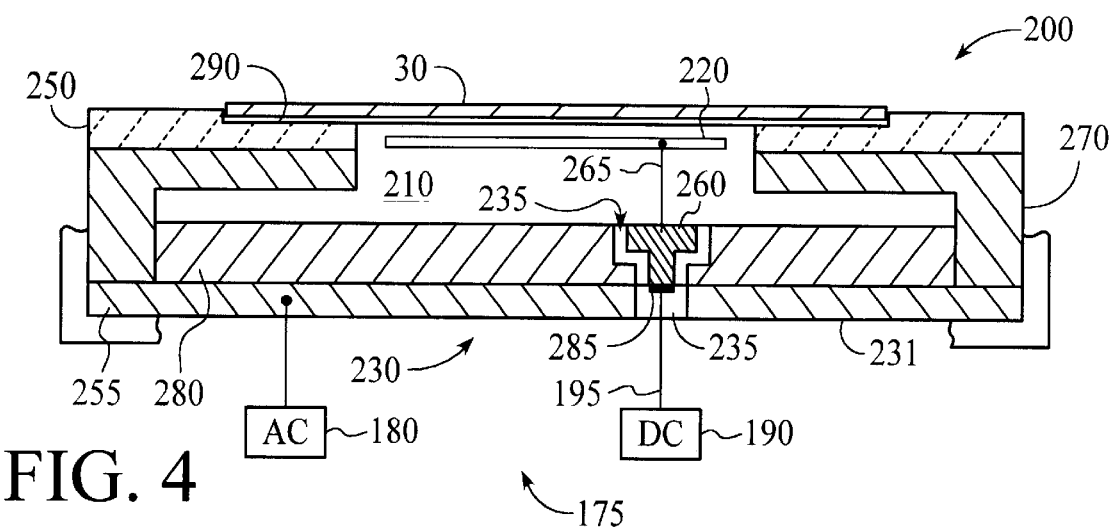
FIG. 4 is a schematic sectional side view of a version of a substrate support having a connector with a conductive member.

Another version of the invention is shown in FIG. 3. In this version, the conductor 230 comprises a first conductor 231 and a conductive interposer 280 between the first conductor 231 and the dielectric 210. The use of the interposer 280 allows for easy construction of the support 200. For example, the interposer 280 can be separately manufactured and the dielectric material 235 and the conducting plate 260 can be formed therein. The interposer 280 can then be installed on a cathode of a process chamber to convert the chamber to a chamber with improved plasma generating ability or to replace a polyimide electrostatic chuck with a ceramic electrostatic chuck. The conductive interposer 280 may be coupled to the conducting plate 260 through RF coupling capacitor 245, as shown in FIG. 3, or by capacitive coupling through the dielectric material 235, as shown in FIG. 4. Thus, the RF voltage applied directly to the first conductor 231 is conducted to the interposer 280 and capacitively coupled to the electrode 220. Alternatively, RF voltage applied to the connector 195 may be capacitively coupled to the interposer 280 and conducted to the first conductor 231. In one version, a layer, plug, or coating of dielectric material or a sufficiently large space isolates the connector 195 and/or the conductive member 260 from the first conductor 231. The interposer 280 may be composed of the same material as the first conductor 231 or may be composed of different conductive material. The interposer 280 and the first conductor 231 may contact or may otherwise be electrically connected to collectively form a conductor 230 to which the RF voltage can be applied or to which RF voltage can be coupled.

The use of the interposer 280 is also advantageous when replacing electrostatic chucks in a process chamber 110. For example, it may be desirable to replace a coulombic electrostatic chuck with a Johnsen-Rahbek electrostatic chuck because of the high thermal conductivity and the high attractive forces of the latter. The interposer 280 allows the entire assembly including the interposer 280, the dielectric 210, and the extension 270 (if present) to removed or installed as a complete unit. Furthermore, the interposer 280 provides an interface between a cathode and an electrostatic chuck which allows for a direct switch from a polyimide (or the like) electrostatic chuck to a ceramic (or the like) electrostatic chuck without altering the cathode.

Figure 5:
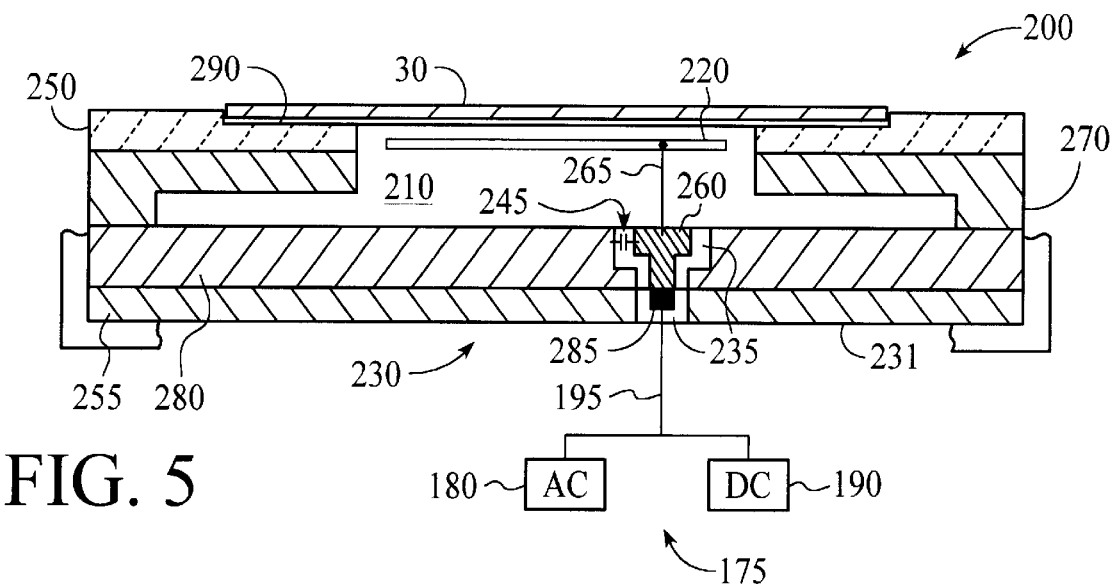
FIG. 5 is a schematic sectional side view of another version of a substrate support having a connector with a conductive member.

FIGS. 4 and 5 show embodiments of supports 200 that may be used in a process chamber 110. In these embodiments a contact plate or plug 285 is provided for supplying the conductive member 260 with DC voltage from DC supply 190 and connector 195. The contact 285 may be a conductive metal that is similar in size and shape to the bottom or contact portion of the conducting plate 260. Alternatively, a banana type clip and plug can be provided. In the versions shown, the contact 285 is embedded within dielectric material 235 so as to be exposed only to the conducting plate 260. The RF voltage may be supplied directly to the conductor 230 by directly supplying the voltage to either the first conductor 230 or to the interposer 280. As also shown in FIGS. 4 and 5, the top surface 290 of the collar 250 may include a rim for containing the substrate 30. Alternatively, the top surface 290 may be planar, or may be other shapes. The top surface 290 may also be coplanar with the top surface 215 of the dielectric 210 or at a higher or lower level.

It is to be understood that the capacitive coupling between the conductor 230 and the conducting plate 260 (or the connector 195) in any of the disclosed embodiments can occur either through the use of an RF coupling capacitor 245 or by capacitive coupling though the dielectric material 235.

Alternatively, a combination of the two coupling modes can be used. For example, an intermediate value capacitor can be used with an intermediate thickness of dielectric material 235. It is to be further understood, as discussed above, that the capacitive coupling can be from the conductor to the connector 195 (or conductive member 260) or may be from the connector 195 to the conductor 230, as shown for example in FIG. 5.

Figure 6:
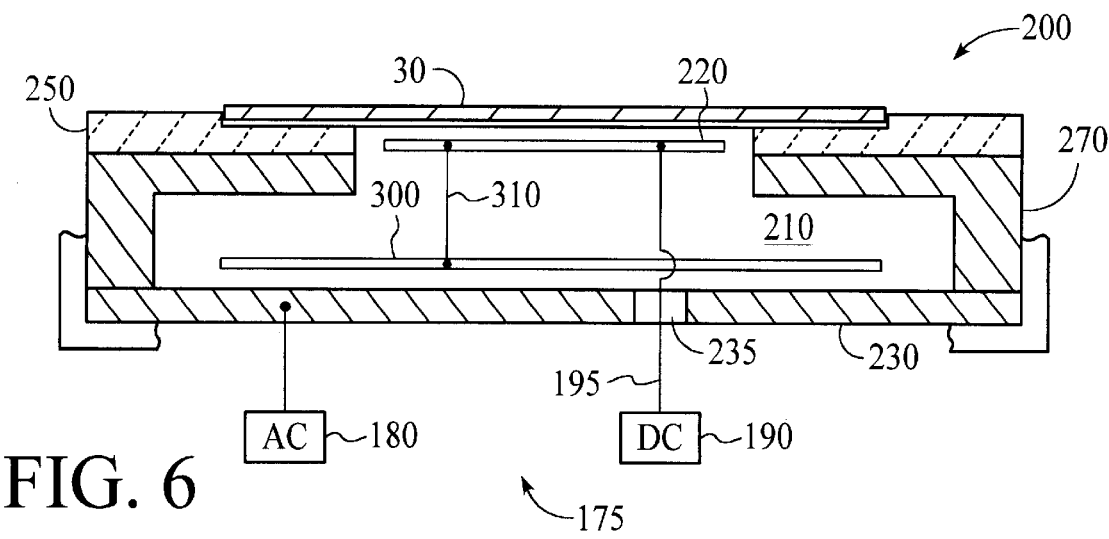
FIG. 6 is a schematic sectional side view of a version of a dual electrode substrate support.

FIG. 6 shows another embodiment of the support 200. The interposer 280 has not been shown in FIG. 6, but may be provided. The embodiment of FIG. 6 comprises a lower electrode 300 in the dielectric 210. The lower electrode 300 is used to provide the electrode 220 with an RF voltage. The RF voltage is supplied to the conductor 230 from the AC power supply 180. The conductor 230 and the lower electrode 300 capacitively couple through a layer of dielectric 210. The RF voltage is then supplied to the electrode 220 by a connector 310 extending from the lower electrode 300 to the electrode 220. The DC voltage is supplied to the electrode in an isolating manner as described above. The thickness of the layer of dielectric 210 below the lower electrode 300 may be sufficiently thin to allow the downward component of the electric field from the lower electrode 300 to capacitively couple RF power from the underlying conductor 230 without excessive attenuation of the RF field. The thickness of the dielectric below the lower electrode 300 can be set to control the delivery of RF power to the lower electrode 300 and subsequently to the electrode 220. In one embodiment, the thickness is from about 1 micron to about 5 mm, more preferably from about 100 microns to about 5 mm, and most preferably from about 500 microns to about 3 mm, as described in U.S. patent application Ser. No.08/931,708, filed on Sep. 16, 1997, and entitled "Plasma Chamber Support Having an Electrically Coupled Collar Ring" which is incorporated herein by reference. Alternatively the lower electrode 300 and connector 310 can be removed and the thickness of the dielectric 210 can be selected to capacitively couple the conductor 230 and the electrode 220 or a capacitor 245 can connect the conductor 230 to the electrode 220.

The plasma processing apparatus 100 of the present invention can be used to deposit, etch, or implant material on or otherwise process the substrate 30, and is particularly useful for providing uniform plasma processing across the substrate surface. To use the apparatus 100, the substrate 30 is placed in the process chamber 110, and process gas is introduced in the process chamber 110 via the gas distributor 120 at a controlled pressure. Process gas flow rates, chamber pressure, and substrate temperature depend on the process. Chemical vapor deposition (CVD) processes to deposit coatings on the substrate 30 are generally described in Chapter 9, VLSI Technology, 2nd Ed., Ed. by Sze, McGraw-Hill Publishing Co., New York, which is incorporated herein by this reference. Typical chemical vapor deposition (CVD) processes for depositing $SiO_2$ on a substrate, use process gases such as (i) silicon source gas, for example $SiH_4$ or $SiCl_2H_2$, and an oxygen source gas such as $CO_2$ or $H_2O$, or $N_2O$; or (ii) a single gas containing both silicon and oxygen such as $Si(OC_2H_5)_4$. CVD processes for depositing silicon or $Si_3N_4$ on the substrate typically use gases such as $SiH_4$, $NH_3$, $N_2$, $B_2H_6$, HCl, and $PH_3$. Other conventional CVD process gases include $NH_3$, $AsH_3$, $B_2H_6$, HCl, $PH_3$ and $SiH_4$. The apparatus 100 can also be used for plasma etching processes as generally described in *VLSI Technology, Second Edition*, Chapter 5, by S. M. Sze, McGraw-Hill Publishing Company (1988), which is incorporated herein by reference. Typical etching processes use process gases such as $BCl_3$, $Cl_2$, $SF_6$, $NF_3$, $CF_4$, $CFCl_3$, $CF_2Cl_2$, $CF_3Cl$, $CHF_3$, $C_2ClF_5$, and the like, and resist etching processes typically use oxygen-containing etchant gas to etch the resist on the substrate. Plasma processes that use $NF_3$ to clean substrates 30 are generally described in U.S. Pat. No. 5,201,990, to Chang, et al., which is also incorporated herein by reference. Typically, the process gas flow rates range from 50 to 3000 sccm; chamber pressures range from 1 mTorr to 100 Torr; and substrate temperatures range from 25 to 500° C.

Thus, the substrate support 200 described above is useful for providing a uniform plasma across a substrate, extending the plasma beyond the edge of the substrate, and stabilizing the plasma. Furthermore, the substrate support 200 is easy to manufacture and aids in replacing electrostatic chucks in a process chamber.

Although the present invention has been described in considerable detail with regard to the preferred embodiments thereof, other embodiments are possible and can be made without departing from the scope of the invention. For example, the interposer may comprise other configurations and structures that would be apparent to one of ordinary skill in the art. Therefore, the appended claims should not be limited to the descriptions of the preferred embodiments contained herein.

What is claimed is:

1. A support capable of supporting a substrate in a chamber, the support comprising:

a first dielectric covering an electrode, the first dielectric having a surface capable of receiving the substrate;

a conductor capable of capacitively coupling with the electrode;

a voltage supply adapted to supply an RF voltage having a frequency to the conductor; and a second dielectric between the conductor and the electrode, the second dielectric having an RF reactance of about 100 to about 10000 ohms at the frequency of the RF voltage.

2. A support according to claim 1 wherein the thickness of the second dielectric between the conductor and the electrode is selected to allow capacitive coupling of the conductor and the electrode through the second dielectric.

3. A support according to claim 2 wherein the thickness of the second dielectric between the conductor and the electrode is from about 25 microns to about 500 microns.

4. A support according to claim 1 further comprising a connector adapted to supply a voltage to the electrode, wherein the conductor is capable of capacitively coupling with the connector.

5. A support according to claim 4 wherein the connector comprises a conductive member.

6. A support according to claim 1 wherein the electrode is in the first or second dielectric.

7. A support according to claim 1 further comprising a DC voltage source adapted to supply an electrostatic chucking voltage to the electrode.

8. A process chamber capable of processing a substrate in a plasma, the process chamber comprising:

a gas distributor adapted to introduce process gas in the chamber;

a first dielectric covering an electrode, the first dielectric having a surface capable of receiving the substrate;

a conductor capable of capacitively coupling with the electrode;

a voltage supply adapted to supply a gas energizing RF voltage having a frequency to the conductor; and a second dielectric between the conductor and the electrode, the second dielectric having an RF reactance of about 100 to about 10000 ohms at the frequency of the RF voltage.

9. A process chamber according to claim 8 further comprising a collar and wherein the conductor is capable of capacitively coupling with the plasma through the collar.

10. A process chamber according to claim 8 wherein the thickness of the second dielectric between the conductor and the electrode is selected to allow capacitive coupling of the conductor and the electrode through the second dielectric.

11. A process chamber according to claim 8 further comprising a collar on a peripheral portion of the conductor.

12. A process chamber according to claim 11 wherein the peripheral portion of the conductor extends beyond the electrode.

13. A support capable of supporting a substrate in a chamber, the support comprising:

a first dielectric covering an electrode, the first dielectric having a surface capable of receiving the substrate;

a connector capable of supplying a voltage to the electrode;

a conductor capable of capacitively coupling with the connector;

a voltage supply adapted to supply an RF voltage having a frequency to the conductor or to the electrode; and a second dielectric between the conductor and the connector, the second dielectric having an RF reactance of from about 0.01 to about 50 ohms at the frequency of the RF voltage.

14. A support according to claim 13 comprising a voltage supply adapted to supply an RF voltage to the connector.

15. A support according to claim 13 wherein the thickness of the second dielectric between the conductor and the connector is selected to allow capacitive coupling of the conductor and the electrode through the second dielectric.

16. A support according to claim 13 wherein the connector comprises a conductive member.

17. A support according to claim 13 further comprising a DC voltage source adapted to supply an electrostatic chucking voltage to the electrode through the connector.

18. A process chamber capable of processing a substrate in a plasma, the process chamber comprising:

a gas distributor adapted to introduce process gas in the chamber;

a first dielectric covering an electrode, the first dielectric having a surface capable of receiving the substrate;

a connector capable of supplying a voltage to the electrode;

a conductor capable of capacitively coupling with the connector;

a voltage supply adapted to supply a gas energizing RF voltage having a frequency to the conductor or to the electrode; and a second dielectric between the conductor and the connector, the second dielectric having an RF reactance of from about 0.01 to about 50 ohms at the frequency of the RF voltage.

19. A process chamber according to claim 18 further comprising a collar and wherein the conductor is capable of capacitively coupling with the plasma through the collar.

20. A process chamber according to claim 18 wherein the thickness of the second dielectric between the conductor and the connector is selected to allow capacitive coupling of the conductor and the connector through the second dielectric.

* * * * *